(12) United States Patent
Ebner

(10) Patent No.: US 9,234,644 B2
(45) Date of Patent: Jan. 12, 2016

(54) OPTICAL ELEMENT

(75) Inventor: Stephan Ebner, Dornbirn (AT)

(73) Assignee: ZUMTOBEL LIGHTING GMBH, Dornbirn (AT)

( * ) Notice: Subject to any disclaimer, the term of this patent is extended or adjusted under 35 U.S.C. 154(b) by 32 days.

(21) Appl. No.: 14/131,626

(22) PCT Filed: Jul. 5, 2012

(86) PCT No.: PCT/EP2012/063187
§ 371 (c)(1),
(2), (4) Date: Feb. 10, 2014

(87) PCT Pub. No.: WO2013/007610
PCT Pub. Date: Jan. 17, 2013

(65) Prior Publication Data
US 2014/0168972 A1    Jun. 19, 2014

(30) Foreign Application Priority Data

Jul. 8, 2011  (DE) .......................... 10 2011 078 865
Oct. 27, 2011  (DE) .......................... 10 2011 085 275

(51) Int. Cl.
*F21V 5/00* (2015.01)
*F21V 5/04* (2006.01)
(Continued)

(52) U.S. Cl.
CPC ............. *F21V 5/048* (2013.01); *B29C 45/0003* (2013.01); *B29C 45/16* (2013.01); *B29D 11/0048* (2013.01); *F21K 9/50* (2013.01); *F21V 5/007* (2013.01); *F21V 5/04* (2013.01); *F21V 7/0066* (2013.01); *G02B 19/0066* (2013.01); *G02B 27/0955* (2013.01);
(Continued)

(58) Field of Classification Search
CPC ............ F21V 5/04; F21V 5/046; F21V 5/048

USPC ............................ 362/308, 310, 311.02, 329
See application file for complete search history.

(56) References Cited

U.S. PATENT DOCUMENTS 2,254,962 A    9/1941  Harris et al.
5,485,317 A    1/1996  Perissinotto et al.
(Continued)

FOREIGN PATENT DOCUMENTS

CN    101324317    12/2008
DE    29915907    12/1999
(Continued)

OTHER PUBLICATIONS

International Search Report for PCT/EP2012/063187, English translation attached to original, Both completed by the European Patent Office on Sep. 10, 2012, All together 7 Pages.

(Continued)

*Primary Examiner* — Peggy Neils
(74) *Attorney, Agent, or Firm* — Brooks Kushman P.C.

(57) ABSTRACT

An optical element for influencing the light emission of a substantially punctiform light source, in particular an LED. The optical element has a truncated pyramid- or cone-like basic shape with an approximately rectangular base that forms a light-emitting surface, and the optical element also has a cover surface which faces the light source and which forms a light inlet surface. Lateral face regions of the optical element, the regions extending from the cover surface in the direction of the corners of the base, are formed by flat or rotationally symmetrical surface regions.

13 Claims, 4 Drawing Sheets

(51) Int. Cl.
  *F21V 7/00* (2006.01)
  *G02B 19/00* (2006.01)
  *G02B 27/09* (2006.01)
  *H01L 33/58* (2010.01)
  *B29D 11/00* (2006.01)
  *F21K 99/00* (2010.01)
  *B29C 45/00* (2006.01)
  *B29C 45/16* (2006.01)
  *F21Y 101/02* (2006.01)
  *F21Y 103/00* (2006.01)

(52) U.S. Cl.
  CPC ........ *H01L 33/58* (2013.01); *B29C 2045/1601* (2013.01); *F21Y 2101/02* (2013.01); *F21Y 2103/003* (2013.01)

(56) References Cited

U.S. PATENT DOCUMENTS

| | | | |
|---|---|---|---|
| 6,536,923 B1 | 3/2003 | Merz | |
| 6,554,451 B1 | 4/2003 | Keuper | |
| 6,945,674 B2 | 9/2005 | Yoneda et al. | |
| 7,766,509 B1 | 8/2010 | Laporte | |
| 8,007,140 B2 * | 8/2011 | Zhang | 362/311.12 |
| 8,025,429 B2 * | 9/2011 | Ho et al. | 362/311.02 |
| 8,235,547 B2 | 8/2012 | Hofmann | |
| 8,251,550 B2 * | 8/2012 | Lai | 362/311.02 |
| 2005/0094393 A1 | 5/2005 | Czajkowski | |
| 2005/0135106 A1 | 6/2005 | Kittelmann et al. | |
| 2006/0050528 A1 | 3/2006 | Lyons et al. | |
| 2006/0083023 A1 | 4/2006 | Ayabe et al. | |
| 2006/0091414 A1 * | 5/2006 | Ouderkirk et al. | 257/99 |
| 2006/0268556 A1 | 11/2006 | Hsieh | |
| 2007/0195534 A1 | 8/2007 | Ha et al. | |
| 2007/0201225 A1 | 8/2007 | Holder et al. | |
| 2009/0046468 A1 * | 2/2009 | Wang et al. | 362/297 |
| 2009/0225543 A1 | 9/2009 | Jacobson et al. | |
| 2009/0323330 A1 | 12/2009 | Gordin et al. | |
| 2010/0038657 A1 | 2/2010 | Higuchi et al. | |
| 2010/0073938 A1 | 3/2010 | Ho | |
| 2010/0195330 A1 | 8/2010 | Schaefer et al. | |
| 2010/0284194 A1 | 11/2010 | Miyashita et al. | |
| 2010/0295071 A1 | 11/2010 | Tsai et al. | |
| 2011/0096533 A1 | 4/2011 | Sekela et al. | |
| 2011/0103051 A1 | 5/2011 | Wilcox et al. | |
| 2011/0103070 A1 * | 5/2011 | Zhang et al. | 362/311.02 |

FOREIGN PATENT DOCUMENTS

| | | |
|---|---|---|
| DE | 102007054206 | 4/2009 |
| DE | 202009007292 | 10/2010 |
| DE | 102010003805 | 10/2011 |
| EP | 0635744 | 1/1995 |
| EP | 1382960 | 1/2004 |
| EP | 1548356 | 6/2005 |
| EP | 1998105 | 12/2008 |
| JP | 0737401 | 2/1995 |
| JP | 2005093622 | 4/2005 |
| JP | 2008221530 | 9/2008 |
| WO | 0116524 | 3/2001 |
| WO | 2007088665 | 8/2007 |
| WO | 2011015113 | 2/2011 |
| WO | 2011027267 | 3/2011 |

OTHER PUBLICATIONS

Supplemental European Search Report for EP 06746894, Completed by the European Patent Office on Sep. 25, 2009, 2 Pages.

* cited by examiner

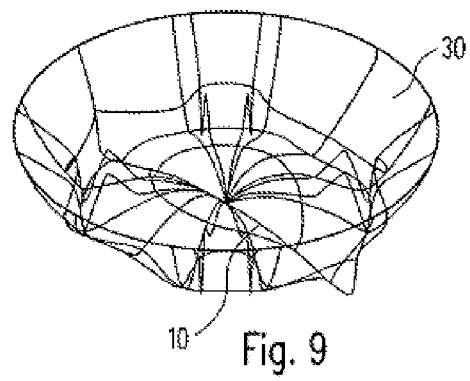
Fig. 9
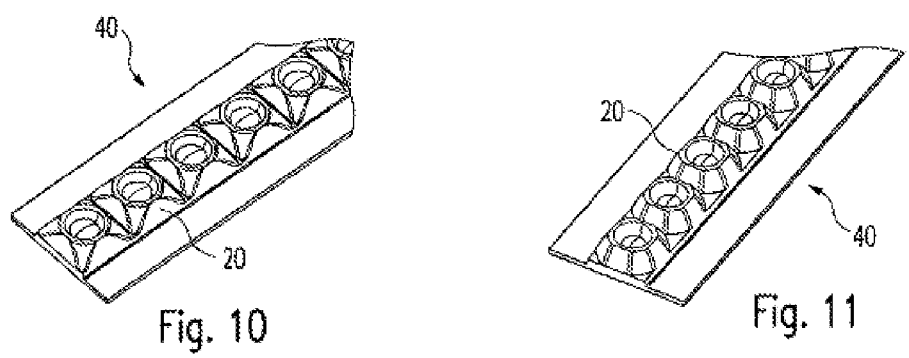
Fig. 10
Fig. 11

OPTICAL ELEMENT

CROSS-REFERENCE TO RELATED APPLICATION

This application is the U.S. national phase of PCT Application No. PCT/EP2012/063187 filed on Jul. 5, 2012, which claims priority to German Patent Application No. 10 2011 078 865.4 filed on Jul. 8, 2011, and German Patent Application No. 10 2011 085 275.1 filed on Oct. 27, 2011, the disclosures of which are incorporated in their entirety by reference herein.

The present invention relates to an optical element for influencing the light emission of a substantially punctiform light source, in particular an LED. Furthermore, the present invention relates to a lighting arrangement comprising one or a plurality of punctiform light source(s) and correspondingly assigned optical elements.

The advancing development of LEDs in recent years has the consequence that such light sources can increasingly be used for lighting purposes. The light intensities that can be obtained with the aid of LEDs are now high enough to enable LEDs to replace traditional light sources such as incandescent bulbs, fluorescent lamps or halogen lamps, for example, used heretofore in almost all areas of application. One advantage with the use of LEDs is that they afford very good possibilities for varying or modifying the light emission. Modern LED-based light sources afford in particular the possibility, for example, of adjusting the color or color temperature of the emitted light.

In principle, LEDs emit light in a comparatively large angular range. It is therefore customary for the LEDs to be assigned optical elements, for example small reflectors or lenses, which restrict or concentrate the light emission to or on a specific spatial region. This makes it possible to ensure that the light emitted overall by the luminaire does not bring about glare or disturbing reflections on a reflective surface, for example a screen or a tabletop, for an observer.

A typical optical element such as is currently used to influence the light emission of one or a plurality of LEDs is illustrated in FIGS. 12 and 13. In this case, FIG. 12 shows an individual optical element 100, whereas FIG. 13 shows an elongate light influencing element 120 consisting of a plurality of integrally interconnected optical elements of this type. Particularly the light influencing element 120 in accordance with FIG. 13 is used, for example, to influence the light emission of an elongate circuit board on which a plurality of LEDs are arranged alongside one another. In this case, a corresponding optical element 100 is assigned to each of the individual LEDs.

The known optical element 100 in accordance with FIG. 12 firstly has a truncated-pyramid-like or truncated-cone-like basic shape, wherein the lateral wings 110 adjacent to the truncated-pyramid-like or truncated-cone-like body serve primarily for retaining the optical element 100 in a luminaire. The light emission surface of said element 100 is accordingly formed by the approximately square base surface 101 of the truncated pyramid, and light is coupled in via the top surface 102 situated opposite the base surface 101. Said top surface is provided with a cutout 103, wherein in the later operating state the LED—not illustrated here—is arranged in the region of said cutout 103. That is to say that the light emitted by the LED enters into the optical element 100 via the bottom surface and the circumferential surface of the cutout 103. One portion of said light then impinges directly on the square base surface 101 and is emitted via the latter, whereas a further portion is refracted upon entry into the optical element 100 in such a way that it is incident firstly against the side surfaces 104. In this case, the shape of the optical element 100 is chosen in such a way that total internal reflection of the light rays takes place at said side surfaces 104, such that said light rays in turn leave the optical element 100 via the square base surface 101. In this case, the geometry both of the cutout 103 and of the side surfaces 104 is chosen so as to result in a desired distribution for the light emitted via the base surface 101.

As is known, the light emission of an LED is approximately rotationally symmetrical. This means that the use of a rotationally symmetrically configured optical element would also be more suitable per se for influencing the light in a desired manner. In this case, however, it would then not be possible for a plurality of optical elements of this type to be integrally interconnected and for closed areal light emission to be obtained here.

The shape of the known optical element as illustrated in FIG. 12 is generally preferred, therefore, since, on account of the square light emission surface, it is possible for a plurality of elements 100 of this type—as illustrated in FIG. 13—to be joined together to form an elongate light influencing element 120, in which case substantially homogeneous light emission then arises across the entire length of the light influencing element 120. Furthermore, by means of a corresponding adaptation of the cutout 103 and of the side surfaces 104, it is possible to adapt the light emission characteristic within desired regions.

It has now been found, however, that, in the case of the optical element in accordance with FIG. 12 or the light influencing element from FIG. 13, sufficient suppression of glare of the emitted light is not obtained under specific angular ranges. The reason for this is that stray light occurs at the four edges 105 of the truncated-pyramid-like body and leaves the optical element in a substantially uncontrolled manner. This leads to a reduction of the optical efficiency particularly in the so-called C-planes 45, 135, 225 and 315.

The present invention is based on the stated object, therefore, proceeding from the known optical element, of further improving said optical element in such a way that the efficiency thereof can be increased.

The object is achieved by means of an optical element comprising the features of claim 1. The dependent claims relate to advantageous developments of the invention.

The optical element according to the invention also firstly has a truncated-pyramid-like or truncated-cone-like basic shape having an approximately rectangular, in particular square, base surface, which forms the light emission surface of the optical element and allows a plurality of element of this type to be joined together. Light is coupled in once again at the top surface of the optical element, which is situated opposite the base surface. However, in order now to reduce the stray light components that occur in the known optical element, the invention provides for trimming the edges of the truncated pyramid. In particular, the edges are trimmed in such a way as to produce surface regions which extend from the top surface in the direction toward the corners of the base surface and which are embodied in a planar or rotationally symmetrical fashion. It has been found that as a result of this measure, on account of the closed surface regions now formed and the avoidance of sharp edges or corners, the stray light component can be reduced and the optical efficiency of the optical element can be significantly increased.

The invention in other words proposes an optical element for influencing the light emission of a substantially punctiform light source, in particular an LED, wherein the element has a truncated-pyramid-like or truncated-cone-like basic shape having an approximately rectangular base surface forming a light emission surface, and having a top surface facing the light source and forming a light entrance surface, and wherein, according to the invention, regions of the lateral surface of the optical element which extend from the top surface in the direction toward the corners of the base surface are formed by planar or rotationally symmetrically embodied surface regions.

As a result of this combination according to the invention of so-called lens elements with different basic geometries and symmetries, ultimately an optical element is obtained which allows the sought or preferred rectangular, in particular square, light exit surface to be maintained, but at the same time makes it possible to increase the optical efficiency, in particular in the C-planes 45, 135, 225 and 315. The measure according to the invention leads to an optimization of the light distribution curve since, in particular, the proportion of stray light can be reduced and the light guiding can be improved, which also leads to better suppression of glare. The lighting efficiency that can ultimately be obtained can be significantly increased as a result.

The remaining regions of the lateral surface of the optical element, which are also designated hereinafter as side surfaces, can be configured in different ways. In one example they may be formed by planar or curved surface regions. In this case, however, said side surfaces can additionally also be structured, in particular provided with facets and/or spherical caps. As a result, the light distribution curve ultimately obtained can be adapted to specific desires in each case in a targeted manner.

The top surface of the optical element can be embodied in a rotationally symmetrical or polygonal fashion. In particular, it preferably once again has a cutout, as is already known from the prior art. In this case, the lateral surface of the cutout can follow a parabola, an ellipse shape or a so-called spline. The bottom surface of the cutout can be embodied in a planar or curved fashion, depending on the desired light emission characteristic. In accordance with one particular embodiment, in this case, in particular, provision can also be made for the cutout to have an indentation. Said indentation forms a so-called beam splitter for the incident light of the LED, such that the light distribution curve ultimately obtained has two lateral wings. Such a light emission characteristic, which is often also designated as a batwing distribution, is particularly desired in specific applications since, firstly, it avoids glare at shallow viewing angles and, secondly, disturbing reflections on a horizontal surface are avoided. Ultimately, therefore, by means of a corresponding adaptation of the different constituent parts of the optical element, it is possible for the light emission characteristic to be adapted precisely to a desired distribution.

The invention will be explained in greater detail below with reference to the accompanying drawing, in which:

FIG. 9 shows the configuration of a particularly preferred entrance surface for the optical element according to the invention;

FIGS. 10 and 11 show variants of light influencing elements which consist of a plurality of joined-together optical elements according to the invention.

Figure 1:
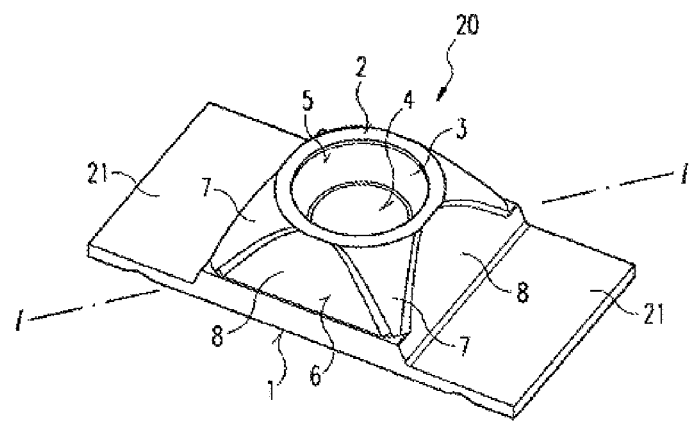
FIG. 1 shows a first exemplary embodiment of an optical element according to the invention.

Firstly, the procedure according to the invention for creating an optical element will be explained with reference to FIG. 1. Further variants will then be explained with reference to the following figures.

The optical element according to the invention, provided generally with the reference sign 20, is once again embodied from a transparent material, preferably plastic, in a truncated-cone-like or truncated-pyramid-like manner. Transparent wings 21 adjoin on both sides of the optical element 20, said wings serving primarily for mounting the element 20 on a luminaire or a luminaire body. The influence of these lateral wings 21 on the light emission is negligible, however, even if a slight proportion of the light is coupled into said wings 21, such that the latter appear to be slightly illuminated.

The actual light emission of the optical element 20 according to the invention takes place, however, once again via the base surface 1, that is to say the underside of the truncated cone or truncated pyramid, the planar base surface 1 being embodied in a rectangular, preferably square, fashion. As has already been explained in the introduction, this planar rectangular configuration of the base surface 1 has the effect of enabling a plurality of optical elements 20 of identical type to be strung together, homogeneous or uniform light emission then being obtained across the entire surface.

Figure 12:
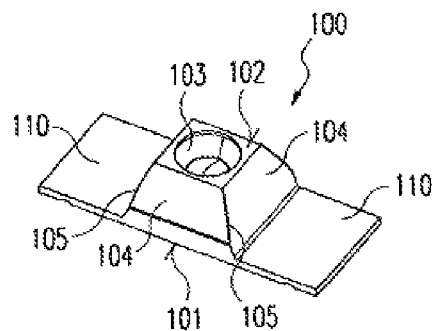

The top surface 2 of the optical element 20, which is situated opposite the base surface 1, faces the light source and accordingly forms the light entrance region of the optical element 20. Provision is once again made for said top surface 2 to be provided with a cutout 3, which forms the actual light entrance region of the optical element 20. Light rays emitted by the light source therefore enter into the optical element firstly via the bottom surface 4 and secondly via the circumferential surface 5 of the cutout 3. One portion of the light rays then emerges from the optical element 20 directly via the base surface 1, whereas another portion is subjected to total internal reflection at the lateral surface 6 of the optical element 20, such that this portion can subsequently be emitted via the base surface 1. In this case, the lateral surface 6 forms a closed outer surface of the truncated cone, that is to say that it extends continuously or monotonically, in particular without gradations that would form a sawtooth-like structure, from the light entrance region to the base surface. To this extent, the construction of the optical element 20 according to the invention corresponds to that of the known optical element 100 from FIG. 12.

A special feature of the optical element 20 according to the invention, however, now consists in the configuration of the lateral surface 6. The latter is now configured in such a way that there are no longer any sharp edges extending from the corners of the base surface 1 toward the top surface 2. Instead, said edges have been trimmed in a special way so as now to result in novel surface regions 7 extending as closed surfaces from the corners of the base surface 1 toward the top surface 2. In the exemplary embodiment illustrated, said surface regions 7, which are also designated hereinafter as corner surfaces, are configured in such a way that they have rotational symmetry with respect to an axis running through the center of the optical element 20.

The edges occurring heretofore have therefore now been rounded, as seen in the circumferential direction, which ultimately has the effect that the stray light caused heretofore by the sharp edges is greatly suppressed in these regions. Instead, in these regions, too, now the sought total internal reflection of the impinging light rays can be obtained, such that ultimately the efficiency of the optical element 20 according to the invention, as considered overall, is significantly improved.

The remaining surface regions, that is to say the side surfaces 8 of the optical element 20 extending from the four edges of the base surface 1 toward the top surface 2, are initially unchanged, that is to say that they fulfill their lighting task, namely that of reflecting light rays that occur, in the manner customary heretofore.

Figure 5:
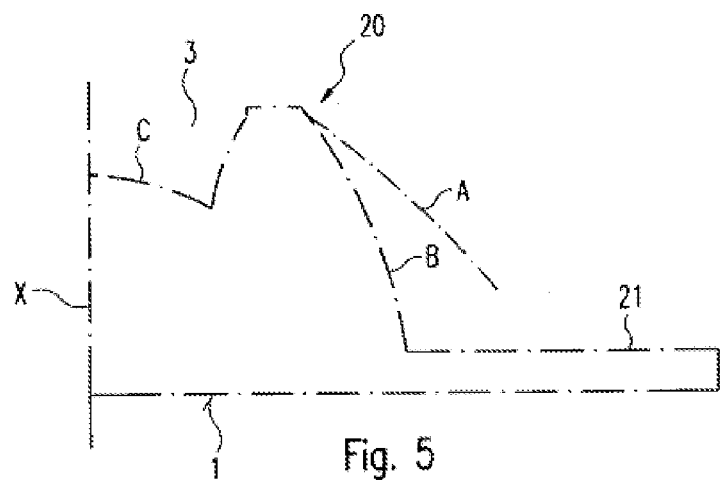
FIG. 5 shows a schematic illustration of the procedure according to the invention for trimming the edges of the optical element.

The procedure according to the invention is clarified schematically again with reference to the illustration in FIG. 5, which shows a partial sectional illustration of the optical element 20 along the axis I-I from FIG. 1, i.e. the illustration runs through a corner region of the optical element 20. In this case, curve A corresponds to the course of the edge region such as is present in the optical element 100 from the prior art in accordance with FIG. 12. According to the invention, said edge region is now trimmed so as to result in a course corresponding to curve B. The previously sharp edge of the truncated pyramid is therefore now replaced by a surface, wherein this surface region—sloping down continuously or monotonically toward the base surface—has rotational symmetry with respect to the central axis X in the exemplary embodiment in accordance with FIG. 1. As will be explained in even greater detail later, the surface region resulting from the trimming of the edge can, however, also be embodied translationally or in a planar fashion. Curve C shows the course of the bottom surface and circumferential surface of the cutout 3, which is configured in the manner known heretofore or adapted depending on the desired emission characteristic.

Figure 6:
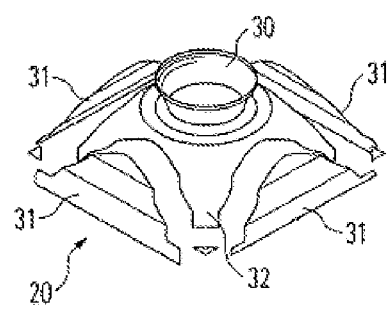
FIG. 6 shows an illustration for elucidating the different components or lens elements of the optical element according to the invention.

The central concept of the invention, therefore, is that of implementing a targeted stringing together of different lens elements with different basic geometries, in particular splines, parabolas, ellipses, etc., and symmetries. FIG. 6 clarifies here what is understood by lens elements, wherein an optical element 20 according to the invention is once again illustrated—this time in an exploded illustration. A first lens element here is the so-called entrance lens 30, which is formed by the cutout 3 in the top surface of the truncated-pyramid-like body. Said entrance lens 30 preferably has rotational symmetry corresponding to the light emission characteristic of an LED. The four side surfaces, that is to say those regions which extend from the four edges of the base surface of the truncated pyramid in the direction of the top surface, are preferably linear or translational lens elements 31. As will be explained in even greater detail later, these linear or translational lens elements, in particular, can also be specially structured in order to optimize the light emission further. The trimming according to the invention of the edge regions, as already explained, furthermore results in rotationally symmetrical lens elements 32 which suppress, in particular, the occurrence of the undesired stray radiation. By virtue of the fact that these different lens elements are influenced in a targeted manner with regard to their shape and are then combined with one another, the light distribution curve ultimately obtained can be individually adapted to specific desires. In this case, the proportions of the overall emission characteristic which are contributed to the latter by the individual lens elements of the optical element 20 have different magnitudes and said individual lens elements can thus illuminate different regions. In this case, between the individual lens elements as well, by means of a targeted course of the transition from one element to the other, the efficiency can be increased and the reduction of the stray light components can be further improved. If the individual lens elements are reduced to their basic lines and the corresponding lines are then linked with a controlled course in a targeted manner, it is possible to produce optimized freeform surfaces, which ultimately leads to an individual configuration of the light distribution curve.

Further conceivable configurations of an optical element according to the invention will be explained below. What is common to all the exemplary embodiments, however, is that, in particular, the edge regions have been trimmed.

Figure 2:
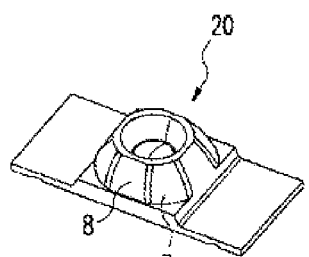
FIGS. 2 to 4 show different exemplary embodiments of further optical elements according to the invention.

In the case of the variant in accordance with FIG. 2, the trimming was once again effected in such a way that the resulting corner surface regions 7 are embodied in a rotationally symmetrical fashion. However, the trimming is now implemented over a larger area in the lower region facing the base surface 1, such that these corner surfaces 7 are now delimited by a lower curved line. The side surfaces 8 are embodied in an unchanged manner and can be planar or follow a slightly curved curve.

Figure 3:
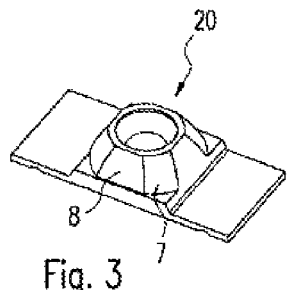

In the exemplary embodiment in FIG. 3, the edges are trimmed in such a way that the corner surfaces 7 are now embodied in a planar fashion or translationally. Here—analogous FIG. 2—the lower region of a corner surface 7 is made wide.

Figure 4:
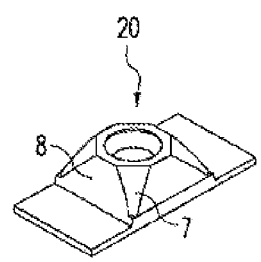

FIG. 4 once again substantially corresponds to the first exemplary embodiment in FIG. 1 with regard to the configuration of the corner surfaces 7, that is to say that the corner surfaces 7 once again taper toward the corner regions of the base surface 1. However, here as well, translational edge trimming has now been effected, that is to say that the corner surfaces 7 are embodied in a planar fashion.

The exemplary embodiments just explained clarify that the optical element according to the invention can be configured diversely. In this regard, by way of example, the cutout 3 of the top surface 2 or the top surface 2 itself can also be embodied in a rotationally symmetrical or polygonal fashion. In any case, however, the originally sharp edges of the truncated pyramid are replaced by surfaces, which, on account of the resultant reduction of the stray light, leads to a significant improvement in the lighting properties.

Figure 7:
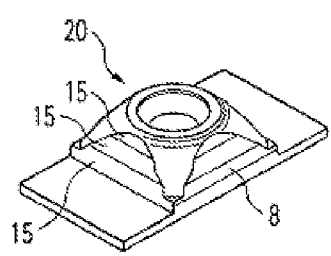
FIGS. 7 and 8 show possible developments of the optical elements according to the invention.

A conceivable development which could be used in any of the above-described exemplary embodiments in FIGS. 1 to 4 is illustrated in FIG. 7. In this case, in particular the side surfaces 8 are embodied in a structured fashion, that is to say provided with facets 15. By means of these additional structural elements, the light distribution curve of the optical element 20 can additionally be influenced in a desired manner, in which case, of course, faceting of the corner surfaces 7 would also be conceivable as an alternative or supplementarily. Moreover, other structuring, for example spherical caps or the like, could also be used.

Figure 8:
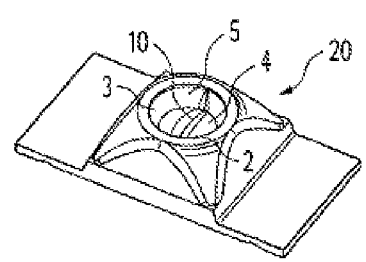
Figure 13:
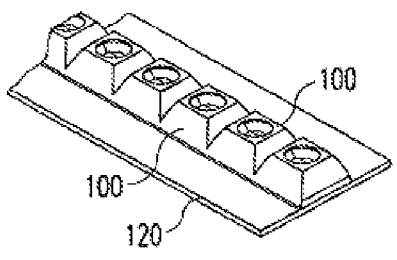
FIGS. 12 and 13 show an optical element and a light influencing element in accordance with the prior art.

An alternative or supplementary development is also illustrated in FIG. 8, wherein in this case the cutout 3 of the top surface 2 is provided with an indentation 10. The indentation 10 extends over both the bottom surface 4 and the circumferential surface 5 of the cutout 2 and brings about splitting of the light incident in the optical element 20 from the light source. As a result, a beam splitter is thus formed, by means of which the light emitted by the optical element 20 is split into two beams oriented substantially symmetrically with respect to a plane defined by the indentation. These two beams are oriented at an angle relative to the vertical, thus resulting in a so-called batwing distribution. Such a light emission characteristic firstly prevents the occurrence of glare if the luminaire is observed at shallow angles. Secondly, disturbing reflections are avoided on horizontal surfaces below the luminaire, with the result that such a light emission characteristic is very highly suitable for example at workplaces but also in other areas. The use of such a beam part in the form of the indentation 10 is in turn conceivable in all the exemplary embodiments described previously.

An optimized configuration for the entrance lens 30 which comprises such an indentation 10, that is to say a beam splitter, is illustrated in greater detail again in FIG. 9. This illustration shows clearly that, by means of a corresponding configuration of the individual lens elements of the optical element according to the invention, the adaptation of the light distribution curve can be optimized and the efficiency can thus be improved.

As already mentioned, one particular advantage of the solution according to the invention is that in the optical element 20, despite a rectangular, in particular a square, light exit surface, uniform light emission can be obtained even though the LED used as the light source has rather a rotationally symmetrical light emission characteristic. This property has the effect that the optical elements according to the invention are particularly well suited to be joined together to form larger light influencing elements. In this case, FIGS. 10 and 11 show two examples of a light influencing element 40, which each consist of a plurality of integrally interconnected optical elements 20, wherein optical elements as in FIG. 1 are used in the light influencing element 40 in accordance with FIG. 10. The light influencing element 40 in accordance with FIG. 11 is based on optical elements 20 of the variant in accordance with FIG. 2. In both exemplary embodiments, uniform light emission with the light emission characteristic sought is obtained across the entire surface of the light influencing element 40, even though the light generation is effected by punctiform light sources. This inherent contradiction is resolved particularly elegantly and effectively by the solution according to the invention.

The invention claimed is:

1. An optical element for influencing the light emission of a substantially punctiform light source, in particular an LED, the element comprising:
   a hollow body having a central axis, a truncated-pyramid-like or truncated-cone-like basic shape outer wall, an approximately rectangular base surface forming a light emission surface, and having a top surface with a central area sized to receive a light source and form a light entrance surface,
   wherein, the outer wall further comprising four side regions extending from the rectangular base surface inwardly toward the top surface, and four corner surfaces alternatively interposed between the four side regions, each extending between a corner of the rectangular base surface to the top surface, forming a planar or rotationally symmetrically segment of the outer wall thereby eliminating sharp internal corners extending from the corners of the rectangular base surface and the top surface, providing an interior surface which continuously expands without graduations between the top surface to the rectangular base surface.

2. The optical element as claimed in claim 1, wherein the four corner surfaces of the optical element are formed by generally planar surface regions.

3. The optical element as claimed in claim 1, wherein regions of the outer wall of the optical element are structured, in particular provided with facets or spherical caps.

4. The optical element as claimed in claim 1, wherein the top surface of the optical element is rotationally symmetrical.

5. The optical element as claimed in claim 1, wherein the top surface of the optical element is embodied in a polygonal fashion.

6. The optical element as claimed in claim 1, wherein the top surface of the optical element has a cutout opening formed therein.

7. The optical element as claimed in claim 6, wherein the four side regions each have a cutout opening of a parabola shape formed therein.

8. The optical element as claimed in claim 6, wherein a bottom surface of the cutout is curved.

9. The optical element as claimed in claim 6, wherein the cutout is formed within an indentation.

10. The optical element as claimed in claim 1, wherein the base surface of the optical element is square.

11. A light influencing element for influencing the light of a plurality of punctiform light sources, in particular LEDs, wherein the light influencing element consists of a plurality of integrally interconnected optical elements as claimed in claim 1.

12. The optical element as claimed in claim 6, wherein the four side regions each join pair of corner surfaces to form a parabola shaped intersection.

13. The optical element as claimed in claim 6, wherein the central area sized to receive the light source forms an indentation.

* * * * *

UNITED STATES PATENT AND TRADEMARK OFFICE
CERTIFICATE OF CORRECTION

| | | |
|---|---|---|
| PATENT NO. | : 9,234,644 B2 | Page 1 of 1 |
| APPLICATION NO. | : 14/131626 | |
| DATED | : January 12, 2016 | |
| INVENTOR(S) | : Stephan Ebner et al. | |

It is certified that error appears in the above-identified patent and that said Letters Patent is hereby corrected as shown below:

Claims

Column 8, Line 41, Claim 12:
After "each join" insert -- a --.

Signed and Sealed this
Nineteenth Day of April, 2016

Michelle K. Lee
*Director of the United States Patent and Trademark Office*